(12) United States Patent
Ellis

(10) Patent No.: US 8,179,380 B2
(45) Date of Patent: May 15, 2012

(54) METHOD AND APPARATUS FOR IMPLEMENTING A CAPACITIVE TOUCH SLIDER

(75) Inventor: John Ellis, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 664 days.

(21) Appl. No.: 12/339,776

(22) Filed: Dec. 19, 2008

(65) Prior Publication Data

US 2010/0156839 A1 Jun. 24, 2010

(51) Int. Cl.
*G06F 3/045* (2006.01)
(52) U.S. Cl. ...................................... 345/174; 178/18.06
(58) Field of Classification Search .................. None
See application file for complete search history.

(56) References Cited

U.S. PATENT DOCUMENTS

| | | | | |
|---|---|---|---|---|
| 4,560,830 A * | 12/1985 | Perl | | 178/18.07 |
| 2008/0142281 A1* | 6/2008 | Geaghan | | 178/18.06 |
| 2009/0184920 A1* | 7/2009 | Francis | | 345/156 |
| 2010/0156839 A1* | 6/2010 | Ellis | | 345/174 |

* cited by examiner

*Primary Examiner* — Jason Olson
(74) *Attorney, Agent, or Firm* — Law Offices of Maximilian R. Peterson

(57) ABSTRACT

A capacitive touch slider array comprises a first conductive trace associated with a first sensing node. The first conductive trace includes a first conductive line and a plurality of first conductive fingers extending from the first conductive line. The plurality of first conductive fingers have lengths that increase from a first end of the capacitive touch slider array to a second end of the capacitive touch slider array. A second conductive trace associated with a second sensing node includes a second conductive line and a plurality of second conductive fingers extending from the second conductive line. The plurality of second conductive fingers have lengths that increase from the second end of the capacitive touch slider array to the first end of the capacitive touch slider array.

17 Claims, 13 Drawing Sheets

ADJACENT PLATE
CAPACITOR WITH SHUNT

METHOD AND APPARATUS FOR IMPLEMENTING A CAPACITIVE TOUCH SLIDER

CROSS-REFERENCE TO RELATED APPLICATIONS

N/A

TECHNICAL FIELD

The present invention relates to capacitive sensor arrays, and more particularly, to a capacitive touch slider array.

BACKGROUND

Computing devices, such as notebook computers, Personal Data Assistants (PDAs) and mobile handsets have user interfaces which are referred to as Human Interface Devices (HID). A touch sensor pad is one type of human interface device that is widely used in these type of devices. A basic notebook touch sensor pad emulates the function of a personal computer mouse. A touch sensor pad is typically embedded within a PC notebook to provide built in portability. A touch sensor pad replicates a mouse's XY movements by using two defined axes which contain a collection of sensor elements that detect the position of a conductive object, such as a finger. Mouse right/left button clicks can be replicated by two mechanical buttons, located in the vicinity of the touch pad, or by tapping commands on the touch sensor pad. The touch sensor pad provides a user interface device for performing such functions as positioning a cursor, or selecting an item on a display. These touch sensor pads can include multi-dimensional sensor arrays or slider arrays. The sensor array may be one dimensional, detecting movement in one axis. The sensor array may also be two dimensional detecting movements within two axes.

Within a capacitive sensor array there is needed the ability to detect differences within the capacitance of a capacitive switch responsive to the placement of a user's finger upon the capacitive switch. In addition to detecting the placement of a finger upon a capacitive switch and the associated change in capacitance caused by the finger, there is the need to make the sensing circuitry resistant to external interferences within the capacitive sensor array. Examples of external interferences include cell phones whose transmissions may cause inadvertent detections of increases of capacitance upon the switch. Additionally, electrical main circuits such as those associated with air conditioning or other high use electrical energy units can cause interference within capacitive sensor arrays. Other types of interferences and inaccuracies within the capacitive sensing circuitries may also lend themselves to errors in detection of particular capacitance values within capacitive sense array circuitry. Thus, there is a need for providing a capacitive touch sensor circuitry that enables the detection of a finger upon a capacitive sense array while limiting the amount of detections based upon external interferences and inaccuracies and interferences inherent within the detection circuitries.

SUMMARY

The present invention, as disclosed and described herein, in one aspect thereof comprises a capacitive touch slider array. The capacitive touch slider array comprises a first and second conductive traces. The first conductive trace is associated with a first sensing node and the second conductive trace is associated with a second sensing node. The first conductive trace includes a first conductive line and a plurality of first conductive fingers extending from the first conductive line. The plurality of first conductive fingers have lengths that increase from a first end of the capacitive touch slider array to a second end of the capacitive touch slider array. The second conductive trace includes a second conductive line and a plurality of second conductive fingers extending from the second conductive line. The plurality of second conductive fingers have lengths that increase from the second end of the capacitive touch slider array to the first end of the capacitive touch slider array.

BRIEF DESCRIPTION OF THE DRAWINGS

For a more complete understanding, reference is now made to the following description taken in conjunction with the accompanying Drawings in which.

DETAILED DESCRIPTION

Figure 1:
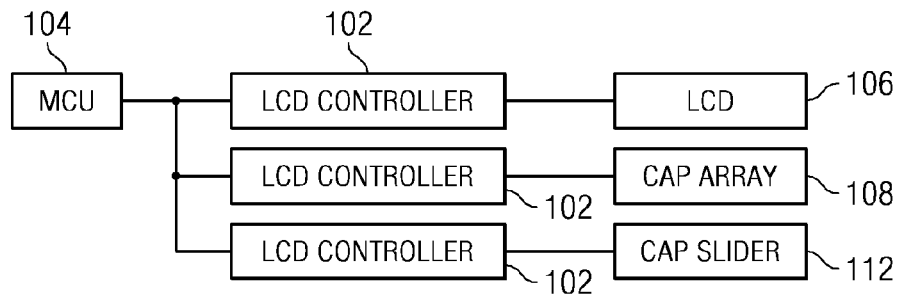
FIG. 1 is a functional block diagram illustrating the controller slaved to a controller chip and controlling a liquid crystal display, a capacitor array and a capacitor slider array.

Referring now to the drawings, wherein like reference numbers are used herein to designate like elements throughout, the various views and embodiments of a method and apparatus for implementing a capacitive touch slider are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to the drawings, and more particularly to FIG. 1, there is illustrated a functional block diagram of a plurality of controller chips 102 that are connected as slave devices to a controlling microcontroller unit 104. The microcontroller 104 can comprise any number of microcontroller units having master control capabilities. The controllers 102 may interface with the microcontroller unit 104 via a SPI interface, SMbus interface, or EMIF interface all in the slave mode. The controllers 102 may be connected to an display 106 or, alternatively, may be used with a capacitor switch array 108 using included capacitive sensor functionalities and control functionalities that will be described herein below, or may be used as a GPIO expander.

As will be described herein below, the MCU 104 is operable to selectively control each of the controllers 102. In general, each of the controllers 102 is addressable via the interconnection therewith through a communication bus 110. This communication bus 110, as will be described herein below, can be a parallel communication bus or a serial communication bus. Each of the controllers 102 is addressable such that data can be transferred to or from each controller 102. These LCD controllers 102 can be enabled or disabled, placed into a low power mode, or into a full power mode. They can each be configured to operate in accordance with a predetermined port configuration information. For example, the controller 102 having the LCD 106 associated therewith is configured as such, although both controllers 102 are identical. Once configured, the controller 102 has data transmitted thereto from the MCU 104 for storage therein which is then used to drive the LCD 106 in the appropriate manner. Generally, when information is sensed from the capacitor array 108 by the controller 102 in a scanning operation, as will be described herein below, an interrupt will be provided, which interrupt is passed back to the MCU 104 through the bus 110 (the bus 110 includes address, control and data information). Thus, the controller 102 operates independent of the MCU 104 during the scanning operation of the capacitor array 108. Once the capacitor array 108 has sensed a touch or a depression of a button, the controller 102 will receive an indication of such, i.e., a "hit," and an interrupt will be generated. Once the interrupt is generated, the MCU 104 then accesses a register in the controller 102 for the purpose of determining which area was touched on the capacitor array 108.

An controller 102 may also be connected with a capacitive slider array 112. The capacitive slider array 112 enables a user to control a user input in a single dimension along a single axis. Thus, using a capacitive slider array, an item such as the volume of speakers, the brightness of a display, the balance of speakers, etc. may be controlled by sliding a finger left, right, up, down, etc. along the capacitive slider array 112.

Sliding switches are used for control requiring gradual adjustments. Examples include a lighting control (dimmer), volume control, graphic equalizer, and speed control. These switches are mechanically adjacent to one another. Actuation of one switch results in partial actuation of physically adjacent switches. The actual position in the sliding switch is found by computing the centroid location of the set of switches activated.

In applications for touch-sensor sliders (e.g., sliding switches) and touch-sensor pads it is often necessary to determine finger (or other capacitive object) position to more resolution than the native pitch of the individual switches. The contact area of a finger on a sliding switch or a touch-pad is often larger than any single switch. In one embodiment, in order to calculate the interpolated position using a centroid, the array is first scanned to verify that a given switch location is valid. The requirement is for some number of adjacent switch signals to be above a noise threshold. When the strongest signal is found, this signal and those immediately adjacent are used to compute a centroid.

In order to report the centroid to a specific resolution, for example a range of 0 to 100 for 12 switches, the centroid value may be multiplied by a calculated scalar. It may be more efficient to combine the interpolation and scaling operations into a single calculation and report this result directly in the desired scale. This may be handled in the high-level APIs. Alternatively, other methods may be used to interpolate the position of the conductive object.

It should be noted that the embodiments described herein are not limited to a touch sensor pad for notebook implementations, but can also be used in other capacitive sensing implementations, for example, the sensing device may be a touch slider 112 as described herein above. Similarly, the operations described herein are not limited to a notebook cursor operation, but can include other operations, such as lighting control (dimmer), volume control, graphic equalizer control, speed control, or other control operations requiring gradual adjustments. It should also be noted that these embodiments of capacitive sensing implementations may be used in conjunction with non-capacitive sensing elements, including but not limited to pick buttons, sliders (ex. display brightness and contrast), scroll wheels, multimedia control (ex. volume, track, advance, etc.), handwriting recognition and numeric keypad operation. The capacitive touch slider 112 may include a single dimension sensor array. The single dimension sensor array comprises a plurality of sensor elements, organized as rows, or alternatively, as columns.

As will also be described herein below, each of the controllers 102 can be placed into a low power mode where all the power is removed internally except for essential parts thereof. For example, the controller 102 associated with the capacitor array 108 could be placed into a low power mode where the capacitor array was merely scanned. The remainder of the chip can be turned off until an interrupt is generated. Once the interrupt is generated, the controller 102 will be powered back up, i.e., enabled, by the MCU 104 after it receives the interrupt. At this time, the controller 102 will receive program instructions from the MCU 104 to reconfigure the controller 102 in such a manner so as to clear all registers therein and reconfigure the device. This is done for the reason that the controller 102 has no memory associated therewith.

Figure 2:
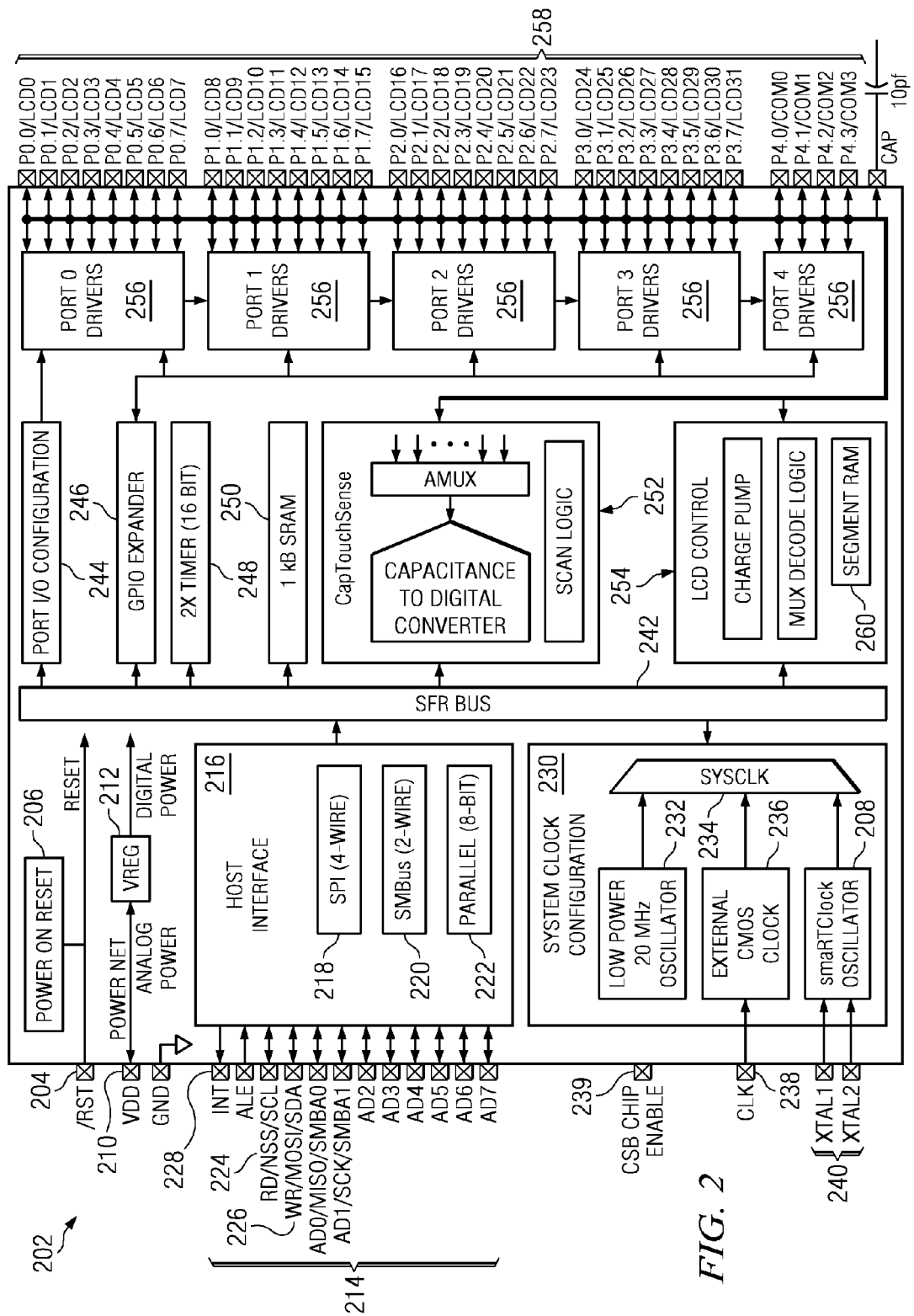
FIG. 2 is a block diagram of the controller chip.

Referring now to FIG. 2, there is illustrated a block diagram of the controller 202. The controller 202 has two main reset sources. These include the RST PIN 204 and the power on reset block 206. The power on reset signal is generated by the power on reset block 206 when the LDO (low dropout regulator) 212 turns on. In low power mode, when the LDO 212 is enabled, a power on reset signal is generated which will reset all of the logic except for the real time clock 208 and the LCD power control block (not shown). These blocks can only be reset via the RST PIN 204 when the LCD low power enable bit is turned off. After this, the real time clock 208 can be reset via either source, although the LCD low power block can still only be reset via the RST PIN 204. System power is provided via a $V_{DD}$ pin 210 to a voltage regulator block 212. The system power applied to $V_{DD}$ pin 210 is used to provide external power to the system through an associated power net and the voltage regulator 212 provides regulated voltage to provide regulated power throughout the LCD controller 202. The power at $V_{DD}$ pin 210 is the raw unregulated power that is used to power the analog circuitry and provide power in low power mode. Basically, this is considered to be $V_{BAT}$ for the battery voltage. It is basically just the external voltage. Note that the regulated power can be disabled in low power mode.

The controller 202 is a slave to an external MCU through a plurality of interface pins 214 connected with the host interface functions 216. The host interface 216 supports a four wire SPI interface 218, a two wire SMBus interface 220 and an eight bit parallel EMIF interface 222, all in a slave mode of operation only. The EMIF interface is described in U.S. patent application Ser. No. 10/880,921, filed Jun. 30, 2004, publication No. 2006/0002210, entitled "ETHERNET CONTROLLER WITH EXCESS ON-BOARD FLASH FOR MICRO- CONTROLLERS," which is incorporated herein by reference in its entirety. The EMIF interface 222 only supports multiplexed access and intel mode. The bus type supported by the host interface 216 is selected via the RST pin 204. A default mode for the controller 202 is the SPI mode, providing for a serial data communication mode of operation. When the controller 202 is held in reset via the RST pin 204 while the RD (read) pin 224 and the WR (write) pin 226 are each held high, the LCD controller 202 will power up in the EMIF mode controlled by the parallel eight bit interface 222. If, while the part is in reset, the RD pin 224 is held high or low while the WR pin 226 is held low, the controller 202 will power up in the SPI mode controlled by SPI interface 218. Finally, if while the controller 202 is held in reset, the WR pin 226 is held high while the RD pin 224 is held low, the controller 202 will power up in the SMbus mode controlled by the SMBus interface 220.

The INT pin 228 is used to indicate the interface mode upon leaving reset mode. Upon exiting the reset mode, the INT (interrupt) pin 228 will be toggled with a frequency of the system clock divided by 2 to indicate that the EMIF bus has been selected. The INT pin 228 will toggle with the frequency of the system clock divided by 8 to indicate that the SPI mode has been selected, and the interrupt pin 228 will be toggled with the frequency of the system clock divided by 32 to indicate the SMBus mode selection. This toggling will go on for 256 system clock cycles after which the INT pin 228 will revert to functioning as the interrupt pin.

As noted herein above, each of the controllers 202 is addressable. When the EMIF interface is utilized, i.e., a parallel address and parallel data is input to the system through this interface, the chip enable pin 239 is utilized, this being the CSB pin. Thus, there will be provided a separate line for each controller 202 from the MCU 104. By enabling the particular chip, the data and address information can be sent thereto such that data can be written to a specifically addressed SFR or read therefrom. As noted herein above, each controller 202 is substantially identical such that the address space for each SFR is the same for each controller 202. As such, there must be some way to distinguish between the two parts. With respect to the serial data bus protocols, the chip enable pin is not required, as each of these two protocols has the ability to address a specific chip. Again, this is part of the protocol. Thus, all that is required to address a particular chip and write data thereto or read data therefrom is a communication path and a particular data communication protocol and an appropriate way to select a particular chip. Further, each of these chips will have a separate interrupt pin that will allow an interrupt to be sent back to the MCU 104. There will, of course, have to be provided one interrupt line for each controller 202 such that the particular controller can be distinguished. What will happen then is that the MCU 104 will take the appropriate action which will typically require the chip to be enabled and, after enabling, download the appropriate configuration information thereto, this assuming that the controller 202 which generated the interrupt were in the low power mode of operation.

The system clock configuration block 230 enables the provision of a system clock signal from up to six clock sources. The low power 20 MHz oscillator 232 may provide a 20 MHz clock signal or alternatively may be divided by 2, 4 or 8 to provide a divided down 20 MHz clock signal to a multiplexer 234 for selection as the system clock. Additionally, external CMOS clock circuitry 236 may be used to provide the clock signal to the multiplexer 234 responsive to an external clock received via a clock pin 238. Finally, a real time clock oscillator 208 may be used to provide a system clock signal to the multiplexer 234. The real time clock is configured via a pair of external pins 240.

The controller 202 boots up running the 20 MHz oscillator 232 in a divide by 4 mode. The controller 202 may then be configured to any of the other clock sources. The internal oscillator can be controlled, i.e., turned on and off, either using an internal control register while running off the CMOS clock or by using an external control mode while toggling a pin (in this case the CMOS_clock pin 238) to turn the internal oscillator on and off. The system clock configuration block 230 and associated clock circuitry therein are described in co pending U.S. application Ser. No. 11/967,389 entitled "Power Supply Voltage Monitor" which is incorporated herein by reference. The system clock configuration 230 with the control register includes a control register bit which may be used to enable a sleep mode of the system clock. When this register bit is set, the clock pin 238 may be used to enable and disable the internal low power oscillator 232 without removing power from the remainder of the controller circuitry. This would comprise a sleep mode wherein the circuitry of the controller 202 remains under system power, i.e., connected to $V_{BAT}$ or $V_{EXT}$ on $V_{DD}$ pin, but no clock signal is provided from the oscillator 232. The real time clock oscillator 208 is unable to be trimmed. The real time clock oscillator 208 requires a 32 KHz oscillator and runs on the $V_{BAT}$ voltage domain, external power. The RTC 208 provides the clock source for the controller 202 both in high and low power modes since it is powered from external power and will not lose power when the LDO 212 is powered down. The RTC clock 208 may be reset by the RST pin 204 only when in low power operation. When in high power mode, the RTC clock 208 might be reset by either the reset pin 204 or the power on reset 206.

The chip enable pin 239 enables the controller 202 to be operated in two different modes. The chip enable pin 239 may be used as a chip select bit and, when in the EMIF communication mode with the external master controller. In a second mode of operation, when a particular bit within an associated SFR register is set, the chip select bit 239 may be used to enable and disable the voltage regulator 212 within the controller 202 without removing power to the rest of the circuitry running on $V_{BAT}$ within the controller 202. In this mode of operation, a bit is set internally that will designate the chip select bit as being an enable/disable pin for the LDO. In this mode of operation, the MCU 104 can generate through a dedicated line to a particular controller 202 a signal that will cause the system to go into a low power mode. In this mode, what will happen is that the LDO will be powered down. This will result in the loss of power to a large block of circuitry, including registers and such. However, there will be a certain portion of the circuitry, such as certain portions of the LCD drivers or capacitive scanning circuitry that will be enabled. The RTC clock will also remain powered, since it is not driven from the output of the LDO 212. In this mode of operation, there will be certain registers that draw little power, but can be powered from the external power which is not regulated and may vary quite a bit. This particular circuitry, of course, is fabricated from high voltage circuitry whereas the circuitry associated with the output of the LDO 212 can have a regulated voltage and can be fabricated from much lower power (lower voltage) circuitry with thinner oxides and the such.

When the system is re-enabled, what will happen is the LDO will be powered up and then a power on reset generated. In this power on reset, what will happen is that certain registers will be cleared, as they may have an unknown state, and then the configuration information is downloaded from the MCU 104 over the communication bus 110 to the controller 202. The reason that this is required is because no flash memory is contained on-chip to the controller 202. If memory were provided, this would not be necessary. However, that results in a much more expensive part and a different fabrication process. Since the MCU 104 has flash memory, it is only necessary to download the information thereto. As noted herein above, one event that can cause the MCU 104 to re-enable the part is the generation of an interrupt by the part. This interrupt indicates the presence of a touch on the capacitive sense array or the change of a value on a GPIO pin or any other pin with the port match feature. The re-enable is necessary in order to service the interrupt. However, during operation where the system is waiting for some change in the capacitive sense array or waiting for some change in data on a port, the part is placed in a low power mode of operation.

Components within the controller 202 communicate via an SFR bus 242. The SFR bus 242 enables connections with a number of components including port I/O configuration circuitry 244, GPIO expander 246, timers 248, SRAM 250, capacitive touch sense circuitry 252 and the LCD control block 254. The port I/O configuration circuit 244 enables control of the port drivers 256 controlling a plurality of general purpose input/output (GPIO) pins 258 to configure the ports as digital I/O ports or analog ports. These GPIO pins 258 may be connected with a liquid crystal display controlled via the LCD control block 254, or alternatively, could be connected with a capacitive sensing array controlled via the cap touch sense circuitry 252. Further, they could be configured to be a digital input or output to allow the MCU 104 to expand its own internal GPIO capabilities.

The GPIO expander 246 offers a connection to 36 GPIO pins 258 for general purpose usage. The GPIO expander 246 allows the MCU 104, which itself has a plurality of pins which can be dedicated to digital input/output functions, to expand the number of pins available thereto. By addressing a particular controller 202 and downloading information thereto while that controller 202 is configured as a GPIO expander, data can be written to or read from any set of the GPIO pins on that controller 202. This basically connects those pins through the port drivers to the SFR bus of the MCU 104.

The GPIO pins 258 can also be used for port match purposes. In the port match mode, each port can be treated as a match target with individual match selects for each pin. The port match process is a process wherein an internal register has a bit associated with a particular input/output pad. This pad will have associated therewith a digital I/O circuit which allows data to be received from an external pin or transmitted to an external pin. When configured as a digital I/O pin, this feature is enabled. However, each pin can also be configured to receive analog data or transmit analog data such that it is an analog pin. When so configured, the digital I/O circuitry is disabled or "tri-stated." The port match feature has digital comparator circuitry external to the pad provided which basically compares the current state of the associated pin with a known bit, this being a bit that is on the pin of the time of setting. When the data changes, this will indicate a change in the state which will generate an interrupt and will load information in a particular register such that this internal register or SFR can be downloaded and scanned to determine which port incurred a change. Of course, the MCU 104 also can just read the port pin itself. What this allows is one pin to be "toggled" to allow a signal to be sent external to the chip (controller 202) to the MCU 104 indicating that new data has arrived. This is a way of clocking data through.

If an ultra low power port match mechanism is desired, the controller 202 can be switched into ultra low power mode and the same register used for the ultra low power mode LCD data can be utilized to save match values. In this mode, the port match is forced to either match on all negative going signals or all positive going signals based on a bit in a configuration register. A port match will cause the generation of an interrupt via interrupt pin 228 which will cause the master controller MCU 104 to have to turn on the LDO 212 by pulling the CS pin low and, after detecting an interrupt, begin communicating with the controller 202.

The timers 248 comprise generic 16 bit timers. Upon overflowing, the timers 248 will generate an interrupt via interrupt pin 228 to the master controller. The timer circuit 248 comprises two 16 bit general purpose timers. One timer is normally used for the SMBus time-out detection within the controller 202. The other timer is used as the capacitive sense time-out timer for the capacitive touch sense circuitry 252. The 1 kB SRAM 250 is offered for general purpose usage and can be read from and written to via any of the three host interfaces 216. The RAM 250 can be unpowered if desired via a configuration bit. Thus in applications that do not require extra SRAM, power can be saved by powering down the RAM. Note that this RAM 250 will lose its contents when the LDO is shut off.

The cap touch circuitry 252, in one embodiment, implements a capacitive touch capability up to a maximum of 128 possible sensing locations. This large number of touch sense pins is supported via an array sensing capability. The cap touch sense circuitry 252 includes three operating modes, the linear auto scan mode, the row/column auto scan mode and the 4×4 scan with LCD mode. Each capacitive pin detection takes approximately 32 microseconds. Thus, sensing 128 possible touch sense locations will take approximately 4.6 milliseconds which is well within any human interface appliance timing requirements. As noted herein above, whenever the system is configured for scanning, the system can operate in a low power mode or in a high power mode. In a low power mode, the system basically waits for some indication that a particular pad has been touched and then generates an interrupt. As will be described herein below, this basically utilizes the analog aspect of each of the pads, i.e., the analog value on each of the pads is sensed.

The controller 202 may reside on a common carrier substrate such as, for example, an integrated circuit (IC), die substrate, a multichip module substrate, or the like. Alternatively, the components of the controller 202 may be in one or more separate integrated circuits and/or discrete components. Alternatively, controller 202 may be one or more processing devices known by those of ordinary skill in the art, such as a microprocessor or central processing unit, a controller, special purpose processor, digital signal processor (DSP), an application specific integrated circuit (ASIC), a field programmable gate array (FPGA) or the like. An alternative embodiment, for example, the processing device may be a network processor having multiple processors including a core unit and multiple micro-engines. Additionally, the processing device may include any combination of general purpose processing devices and special purpose processing devices.

Figure 3:
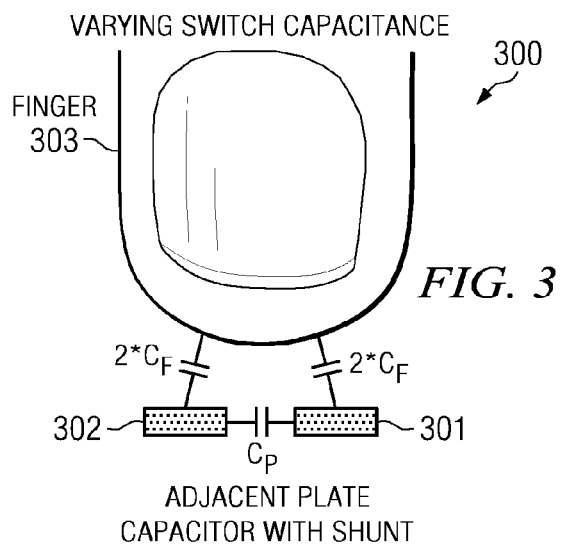
FIG. 3 illustrates a varying switch capacitance.

FIG. 3 illustrates a varying switch capacitance. In its basic form, a capacitive switch 300 is a pair of adjacent plates 301 and 302. There is a small edge-to-edge capacitance Cp, but the intent of switch layout is to minimize the base capacitance Cp between these plates. When a conductive object 303 (e.g., finger) is placed in proximity to the two plate 301 and 302, there is a capacitance 2*Cf between one electrode 301 and the conductive object 303 and a similar capacitance 2*Cf between the conductive object 303 and the other electrode

302. The capacitance between one electrode 301 and the conductive object 303 and back to the other electrode 302 adds in parallel to the base capacitance Cp between the plates 301 and 302, resulting in a change of capacitance Cf. Capacitive switch 300 may be used in a capacitance switch array. The capacitance switch array is a set of capacitors where one side of each is grounded. Thus, the active capacitor has only one accessible side. The presence of the conductive object 303 increases the capacitance (Cp+Cf) of the switch 300 to ground. Determining switch activation is then a matter of measuring change in the capacitance (Cf). Switch 300 is also known as a grounded variable capacitor. In one exemplary embodiment, Cf may range from approximately 10-30 picofarads (pF). Alternatively, other ranges may be used.

Figure 4:
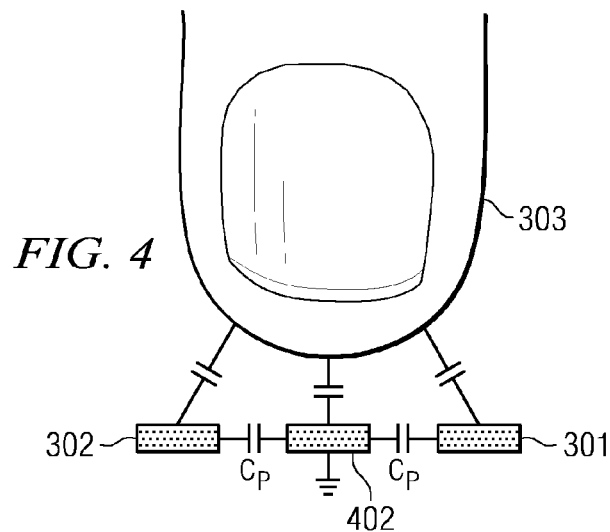
FIG. 4 illustrates an alternative embodiment of a varying switch capacitance.

Referring now to FIG. 4, there is illustrated a varying switch capacitance wherein a ground node 402 between a pair of adjacent plates 301 and 302. There is a small edge to edge capacitance Cp between each of the plates 301 and 302 and the center node 402. When a conductive object 303 is placed in proximity to the two plates 301 and 302 and the ground node 402 a capacitance is formed between each of the plates 301, 302 and the center node 402. The presence of the conductive object 303 increases the capacitance of the switch 300 to ground in a manner similar to that discussed with respect to FIG. 3. Similarly, determining switch activation is a matter of measuring the change in the capacitance.

Figure 5A:
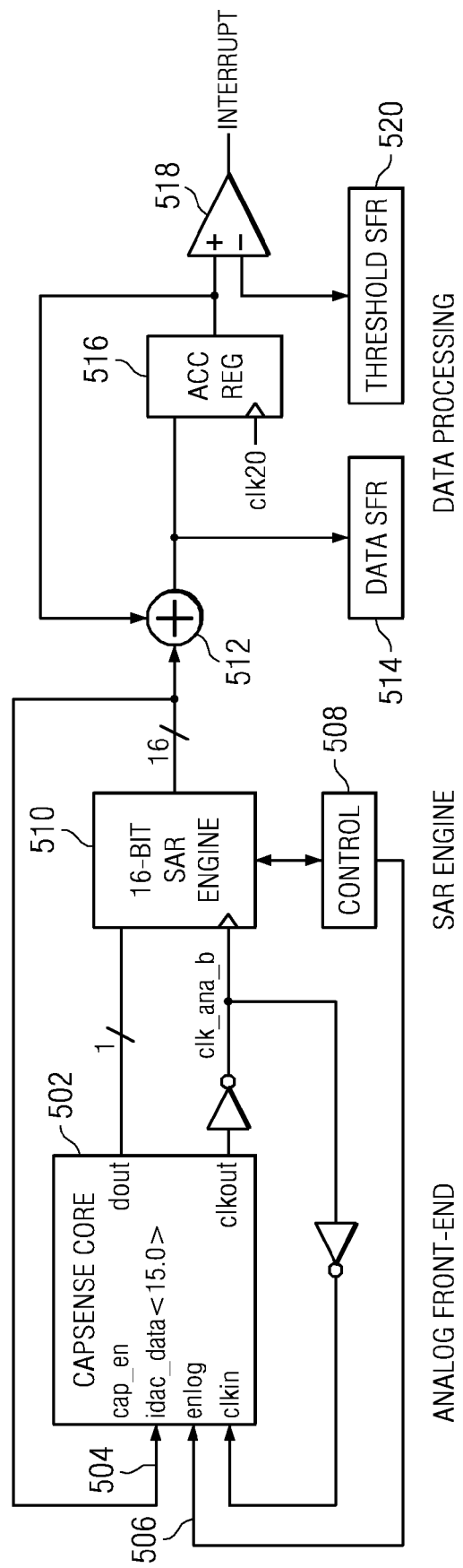
FIG. 5a is a functional block diagram of the capacitive touch sense circuitry of FIG. 2.

Referring now to FIG. 5*a*, there is illustrated a functional block diagram of one embodiment of the capacitive touch sense circuitry 252. The analog front end circuitry 502 is responsible for detecting when a connected capacitive switch has been touched and the value of the capacitance caused by the touch responsive to a comparison between voltages generated at a reference node and a node associated with the capacitive switch, as will be more fully described below. The analog front end circuitry 502 receives a 16 bit current control value which is provided to the input IDAC_DATA via input 504 for controlling a variable current source. The analog front end also receives an enable signal at the input ENLOG 506 from a control circuit 508. The analog front end circuitry 502 additionally provides a clock signal. A 16 bit successive approximation register engine 510 controls a variable current source within the analog front end circuitry 502 that drives the external capacitive switch. The 16 bit SAR engine 510 changes a control value provided to the current provided to the external capacitive switch until the variable current source driving a reference capacitor is equal to a provided reference current source responsive to control signals from control logic 508. Once the SAR algorithm is complete, the 16-bit value represents the capacitance value of the capacitance switch on the external node comprised of the capacitance of the physical switch plus any capicatance due to touching the switch. Essentially, if this value changes over time, this indicates a touch.

The current source control value is also provided to an adder block 512. The control value establishing the necessary control current for the current source is stored within a data SFR register 514 representing the capacitive value of the capacitive switch. An input may then be provided to an accumulation register 516 providing an indication that a touch has been sensed on the presently monitored capacitive switch of the capacitor sensor array. Multiple accumulations are used to confirm a touch of the switch. The output of the accumulation register 516 is applied to the positive input of a comparator 518 which compares the provided value with a value from a threshold SFR register 520. When a selected number of repeated detections of activations of the associated capacitive switch within the capacitor sensor array have been detected, the comparator 518 generates an interrupt to the master controller connected with the LCD controller. The output of the accumulation register 516 is also provided to the adder circuit 512.

Figure 5B:
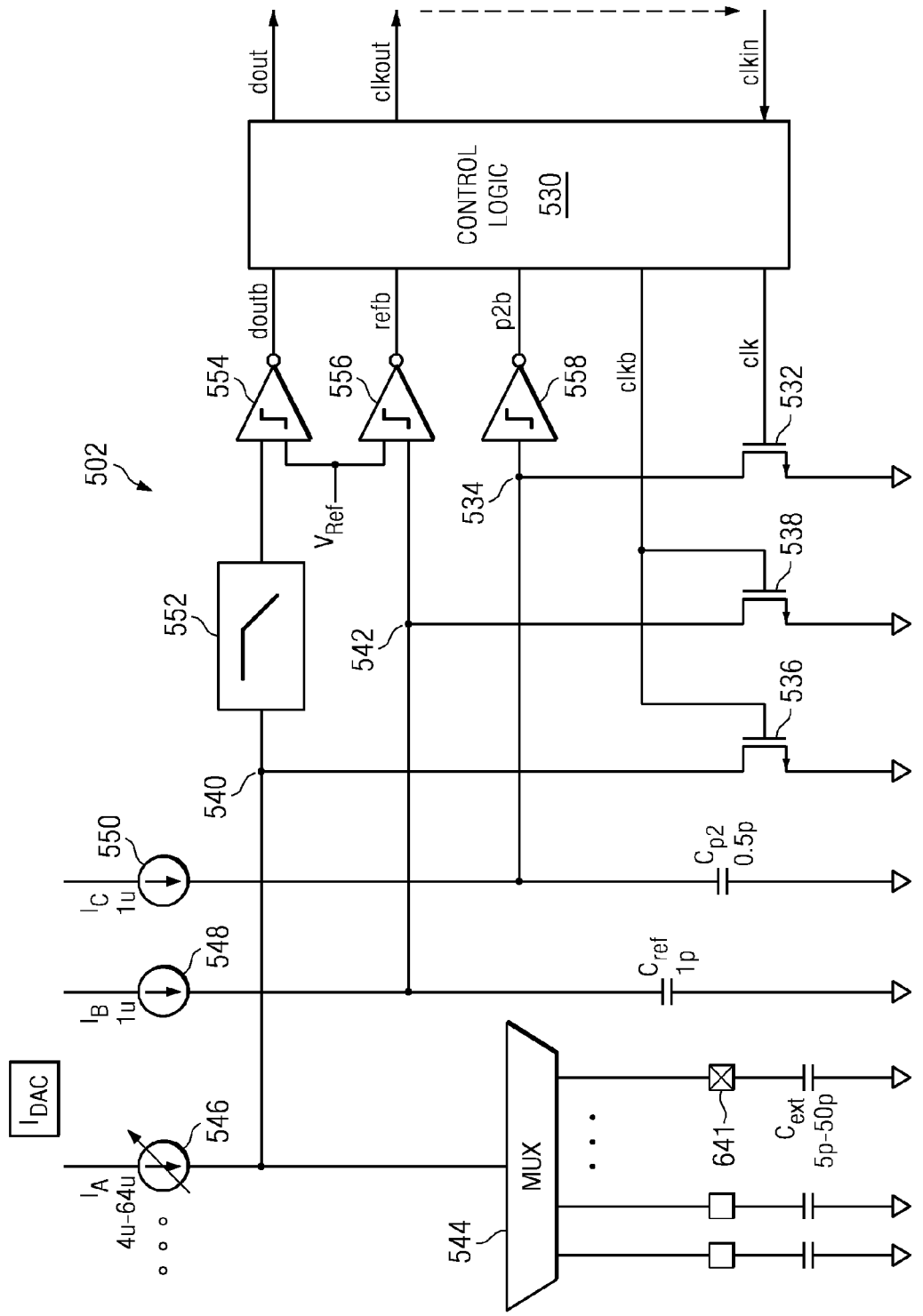
FIG. 5b illustrates a block diagram of the analog front end circuitry.

Referring now to FIG. 5*b*, there is illustrated a more detailed diagram of the analog front end 502. The analog front end circuitry 502 includes control logic 530 that provides an output $D_{OUT}$ that is provided to the successive approximation register engine 510 and the output clock "clk_out." $D_{OUT}$ indicates which monitored node has first reached a reference voltage value. The logic 530 receives an input clock signal "clkn" and provides an output clock signal "clk" and an output clock signal "clkb" (clock bar) to a series of transistors.

The output "clk" is provided to a first transistor 532. The drain/source path of transistor 532 is connected between node 534 and ground. The gate of transistor 532 is connected to receive the "clk" signal. The transistors 536 and 538 are connected to the clock bar signal "clkb." The drain/source path of transistor 536 is connected between node 540 and ground, mode 540 connected to an external pad 541. The drain/source path of transistor 538 is connected between node 532 and ground.

The transistors 536, 538 and 532 act as discharge switches for capacitors $C_{EXT}$, $C_{REF}$ and $C_{P2}$ respectively. Capacitor $C_{EXT}$ is connected between node 540 and ground. Capacitor $C_{REF}$ is connected between node 542 and ground. Capacitor $C_{P2}$ is connected between node 534 and ground. The capacitor $C_{EXT}$ represents the capacitance being detected from the switch of the capacitor sensor array and is variable. The capacitive value thereof can change based upon whether the switch is being actuated by the finger of the user or not. A multiplexer 544 or other switching circuitry may be used to connect other external capacitors within the capacitive switching array to node 540 to determine its capacitive value.

A variable current source 546 provides a current input to node 540. The variable current source is under the control of a 16 bit data control value that is provided from the successive approximation register engine 510. The current source 546 is used for charging the capacitor $C_{EXT}$ UP to a charging voltage when switch 536 is open. When switch 536 is closed, the charging current and the voltage on capacitor $C_{EXT}$ are shorted to ground, thus discharging $C_{EXT}$.

A current source 548 provides a charging current into node 542. This charging current is fixed and provides a charging source for capacitor $C_{REF}$ when switch 538 is open and is shorted directly to ground when switch 538 is closed. Likewise, current source 550 provides a fixed charging current to node 534. This current source 550 is used for charging capacitor $C_{P2}$ when switch 532 is open and is shorted to ground when switch 532 is closed.

Connected to node 540 is a high pass filter 552. The high pass filter 552 is used for filtering out high frequency interference created at the capacitive sense array capacitive switch. The output of the high pass filter 552 is connected to the input of a comparator 554. The comparator 554 compares the voltage at node 540 representing the charging voltage on capacitor $C_{EXT}$ to a threshold reference voltage $V_{REF}$ and generates a negative pulse when the voltage at node 540 exceeds the reference voltage $V_{REF}$. This is provided to the control logic 530 as signal "doutb." Similarly, a comparator 556 compares the voltage of the fixed capacitance $C_{REF}$ at node 542 with the threshold reference voltage $V_{REF}$ and generates an output negative pulse "refb" responsive thereto. Finally, the comparator 558 compares the voltage at node 534 comprising the charge voltage of capacitors $C_{P2}$ with a reference voltage $V_{REF}$ and generates an output responsive thereto as signal "P2B."

The circuit in FIG. 5b operates by initially resetting the voltage on capacitors $C_{EXT}$ and $C_{REF}$ to zero by turning on switches 536 and 538. This causes the voltage on capacitors $C_{EXT}$ and $C_{REF}$ to discharge to ground. The switches 536 and 538 are then turned off, and the voltage on capacitors $C_{EXT}$ and $C_{REF}$ begins to ramp up toward the reference voltage $V_{REF}$ responsive to the respective current sources. If the capacitor $C_{EXT}$ reaches the threshold voltage $V_{REF}$ prior to the voltage on capacitor $C_{REF}$ reaching the threshold voltage, this trips the output of comparator 554 to provide a negative pulse and this information is provided from the logic circuitry 530 as output $V_{OUT}$ to the successive approximation register engine, and a next value of the 16 bit control value for the current source 546 may then be selected based upon $D_{OUT}$.

The control logic 530 generates the $D_{OUT}$ signal controlling the generation of the 16 bit control value by the successive approximation engine responsive to the outputs from comparator 554 and comparator 556. The successive approximation engine initially sets a most significant bit of the 16 bit control value to "one" to control the variable current source 546. If the output of comparator 554 goes high prior to the output of comparator 556, the $D_{OUT}$ signal provides an indication to the successive approximation engine to reset this bit to "zero" and set the next most significant bit to one for a next test of the 16 bit control value. However, when the output of comparator 556 goes high prior to the output of comparator 554 going high, the bit being tested remains set to "one" and a next most significant bit is then tested. This process continues through each of the 16 bits of the 16 bit control value by the successive approximation engine responsive to the signal $D_{OUT}$ from the control logic 530 until the final value of the 16 bit control value to the variable current source 546 is determined.

The "clkb" output resets the voltages across $C_{EXT}$ and $C_{REF}$ by closing switches 536 and 538 to discharge the voltages on these capacitors, and the switches 536 and 538 are opened to enable recharging of capacitors $C_{EXT}$ and $C_{REF}$ using the provided variable current and the reference current respectively. The voltages across the capacitors $C_{EXT}$ and $C_{REF}$ are again compared by comparators 554 and 556 to the threshold reference voltage. When the output of comparator 556 provides a negative output pulse prior to the output of comparator 554 this provides an indication to set an associated bit in the 16 bit control value as described above. The 16 bit control value that is being provided to the variable current source 546 may be stored when a determination is made that the voltage across $C_{EXT}$ and $C_{REF}$ are substantially equal when the associated voltages reach $V_{REF}$ i.e., both voltages ramp-up at substantially the same rate. The current being provided by the variable current source 546 that is associated with the established 16 bit value, the fixed current $I_B$ of current source 548 and the fixed capacitance value $C_{REF}$ may be used to determine the value of the capacitance $C_{EXT}$ according to the equation $I_A/I_B \times C_{REF}$ using associated processing circuitry of the array controller. However, the 16-bit SAR value represents a normalized capacitance value of the external capacitive switch and the actual value is not important.

By using similar circuitry to compare the voltage at nodes 540 and 542 all common mode errors within the circuitry are rejected. Only the filter 552 upsets the common mode balance between the circuits but this is necessary to prevent high frequency interference from outside sources such as cell phones. The circuitry for measuring the voltages at the nodes provides a proportional balance between the internal reference voltage and the external capacitance voltage. Thus, errors within the comparators or the reference voltage $V_{REF}$ are not critical as they are the same in each circuit.

Figure 6A:
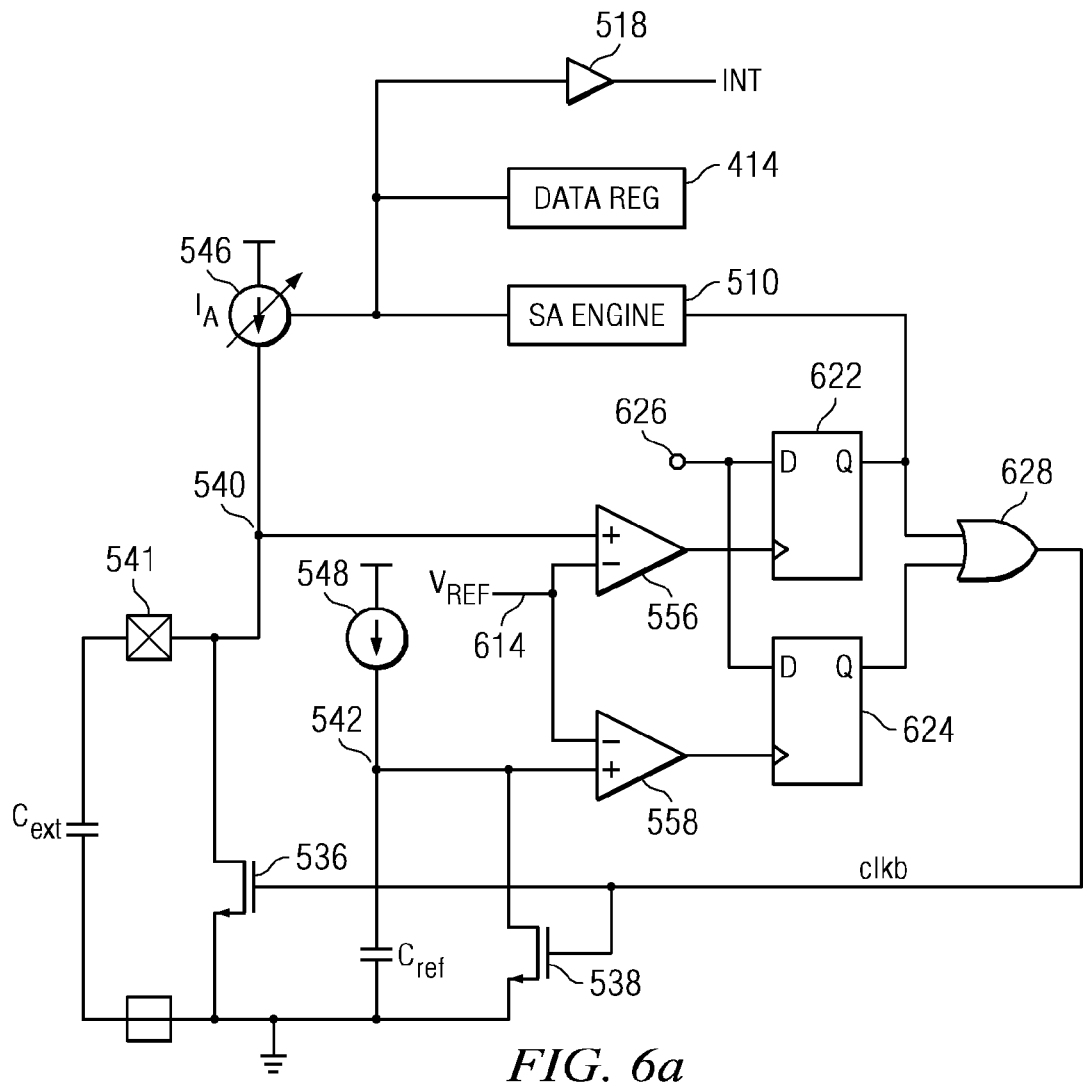
FIG. 6a is a more detailed schematic diagram of the capacitive touch sense circuitry.

Referring further to FIG. 6a, there is more particularly illustrated a simplified schematic diagram of the analog front end circuitry 502 and associated components of the capacitive touch sense circuitry 252 described previously with respect to FIG. 5b and illustrating in more detail the control logic 530. The output of the comparator 556 is provided as a clock input to a flip-flop circuit 622. The output of comparator 552 is provided as a clock input to flip-flop 624. Connected to the D-inputs of each of flip-flops 622 and 624 is a data input from node 626. The data input at node 626 represents a tie to the supply. The outputs of flip-flops 622 and 624 are connected to the inputs of an OR gate 628. The output of flip-flop 622 is additionally provided to the successive approximation engine 510. The OR gate 628 generates an output on each conversion cycle to turn on transistors 630 and 632 to discharge the voltage on each of capacitors $C_{EXT}$ and $C_{REF}$. Transistor 538 has its drain/source path connected between node 542 and ground. The gate thereof is connected to the output of the OR gate 628. The drain/source path of transistor 536 is connected between node 540 and ground. The gate of transistor 536 is also connected to the output of the OR gate 628. When the comparator 556 indicates that an activation of an associated capacitive switch 402 has been detected, the value presently provided from the successive approximation register engine 510 controlling the variable current source 546 is stored within the data register 414 as the capacitive value of $C_{EXT}$. An interrupt is also generated from the comparator 518 as described previously with respect to FIG. 5a to indicate to the master controller that a switch activation has been detected. The interrupt is actually generated as a function of an algorithm that compares the value of previous value of the capacitor at $C_{EXT}$ with the current value, this algorithm comparing successive changes over time in certain circumstances before a "touch" is declared via the interrupt. This operation will be described in more detail hereinbelow.

Thus, the circuitry of FIG. 6a determines a control value provided by the successive approximation engine 510 in order to control the variable current source 606 to provide a voltage ramp-up at node 602 that is substantially equal to the voltage ramp-up at node 604 controlled by reference current source 616. At each clock cycle, a comparison is made of the relative speed at which the voltages at node 602 and 604 ramp-up. The SA engine 510 runs the SAR algorithm to determine a 16-bit SAR value that will result in the ramp-up of the voltages on both nodes 540 and 542 at substantially the same rate. Once the voltage ramp-up values at node 540 and 542 are substantially equal, the control value provided by the SA engine 510 to achieve this result is stored within the data register 414 and this essentially provides a "value" for the capacitor $C_{EXT}$.

Figure 6B:
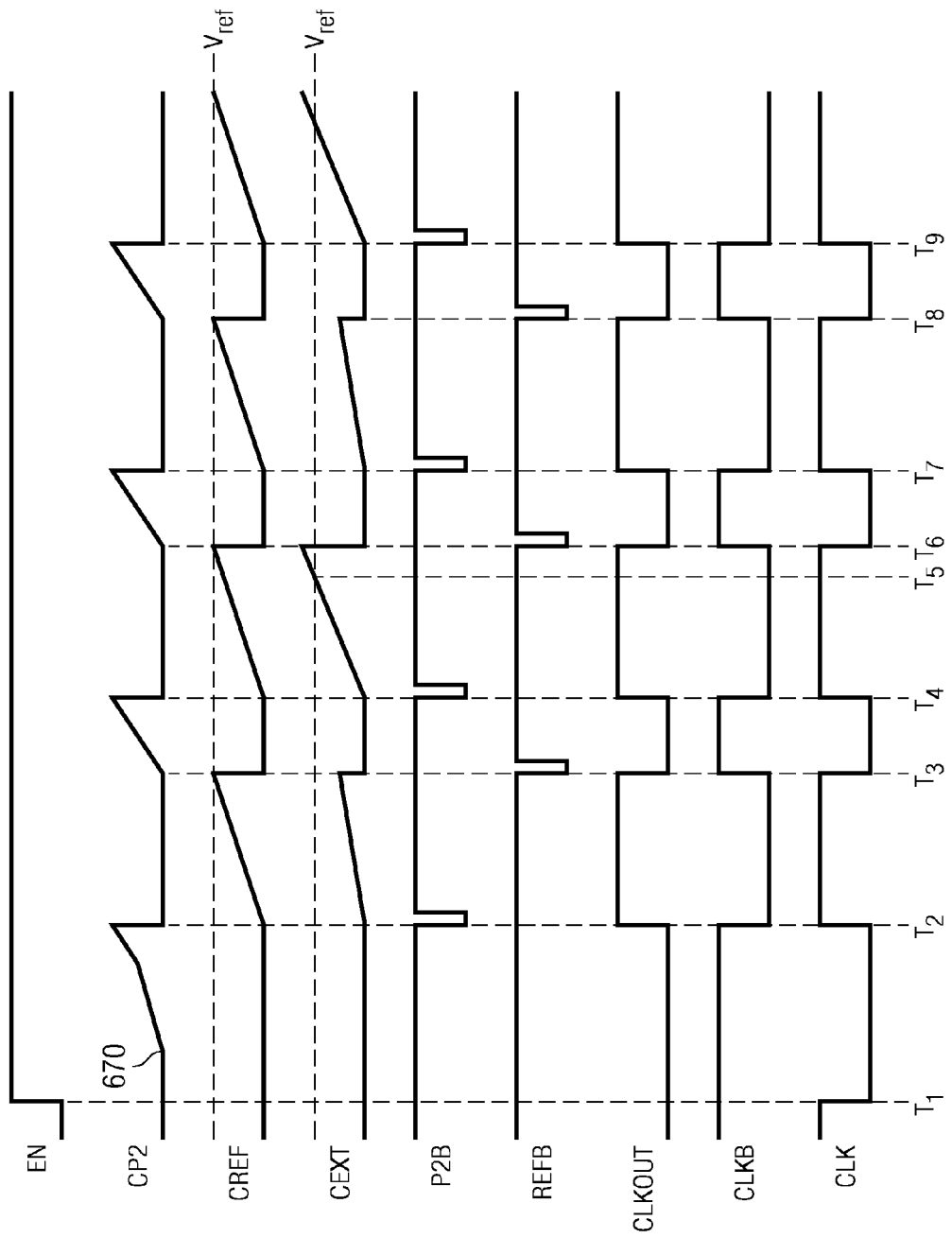
FIG. 6b is a timing diagram illustrating the operation of the circuitry of FIG. 5b.

Referring now to FIG. 6b, there is illustrated a timing diagram describing the operation of the analog front end circuitry 502 of FIG. 5b. Nothing may occur within the analog front end circuitry 502 until the enable signal goes logically "high" at time $T_1$. Responsive to the enable signal going high at time $T_1$ the "clk" signal goes low. Shortly after time $T_1$, the voltage CP2 on capacitor $C_{P2}$ begins ramping up at point 670. When the voltage reaches a set reference voltage level at time $T_2$, the comparator 558 generates a low clock pulse as signal P2B and the CLK signal (and CLKOUT signal) go high. This provides the base clock for the analog front end circuitry 502. The CLKB (clock bar) signal also goes low at the same time. The CLKB signal going low turns off transistors 536 and 538 causing the voltages across $C_{EXT}$ and $C_{REF}$ to begin ramping up on capacitors $C_{EXT}$ and $C_{REF}$ respectively. Once one of voltages $C_{REF}$ or $C_{EXT}$ reaches a reference voltage $V_{REF}$, in this case the voltage $C_{REF}$ reaches the threshold voltage $V_{REF}$ first at time $T_3$, the output of comparator 556 generates a low pulse as signal REFB. This causes the CLKOUT and CLK signals to go low and the CLKB signal to go high. When the CLKB signal goes high, transistors 536 and 538 are turned on causing the voltages $C_{REF}$ and $C_{EXT}$ to be discharged. Turning on transistor 532 by CLK going high causes a voltage CP2 to begin ramping up on capacitor $C_{P2}$. This voltage continues to ramp up until it reaches a reference voltage at time $T_4$ causing the output of comparator 558 P2B to pulse low. This causes clock signal CLK and CLKOUT to go high and clock signal CLKB to go low. This discharges the capacitance voltage on capacitor $CP_2$ and begins ramping up of the voltages on capacitors $C_{EXT}$ and $C_{REF}$.

At time $T_5$, the voltage $C_{EXT}$ on capacitor $C_{EXT}$ reaches the reference voltage prior to the voltage $C_{REF}$ reaching the reference voltage. When the voltage $C_{REF}$ reaches the reference voltage at time $T_6$, a low pulse is generated on REFB and the CLKOUT signal and CLK signal goes low while the CLKB signal goes high. This discharges the voltage $C_{REF}$ and $C_{EXT}$ and begins charging of capacitor $C_{P2}$ with voltage CP2. The process repeats as necessary for each of the 16-bits of the SAR algorithm.

With further reference to the timing diagram of FIG. 6b and the diagrams of FIGS. 5a, 5b and 6a, the operation will be described in more detail. As noted herein above, the basic clock is provided by CP2. This is to ensure that each bit of SAR is detected on a periodic basis. However, it is noted that what CP2 does is provide ½ of the clock cycle, i.e., that portion when the clock cycle is low. This defines that the time between the period at which one of the signals $C_{REF}$ or $C_{EXT}$ has reached the threshold voltage and the time at which the next bit is tested, i.e., the next ramp-up is initiated. The other half of the clock cycle is determined by the ramp speed and this can be variable. Thus, the clock is not necessarily periodic.

With reference to the two ramp voltages for $C_{REF}$ and $C_{EXT}$, this basically represents a race to the threshold voltage. It is noted that both of the comparators 554 and 556 are fabricated with the same circuitry along the same chip and, therefore, current drifts with temperature, delays, etc. will be substantially identical such that any variations thereof will be rejected on a common mode basis. It is not important that there is a delay in the amount of time that the ramp-up takes, as this delay will be reflected in all 16 bits of the SAR algorithm that are tested. Further, to provide additional immunity from high frequency noise, over and above that associated with the filter 552, these comparators 554 and 556 are designed to be somewhat "sluggish," and such can be accommodated in the SAR algorithm. This provides additional noise immunity. Even if there were a DC offset for some reason on the external pin to which $C_{EXT}$ is connected, it is noted that this DC offset would be present for the entire time. Further, upon a later testing of the capacitor, the DC offset would still be present such that a change in the "normalized" capacitive value could be detected. Thus, with the use of this SAR algorithm, it only takes 16 cycles to determine a 16 bit value for the capacitor as opposed to other solutions that might use a counter to count pulses of a clock, the timing of which is defined by an external capacitor.

Figure 7:
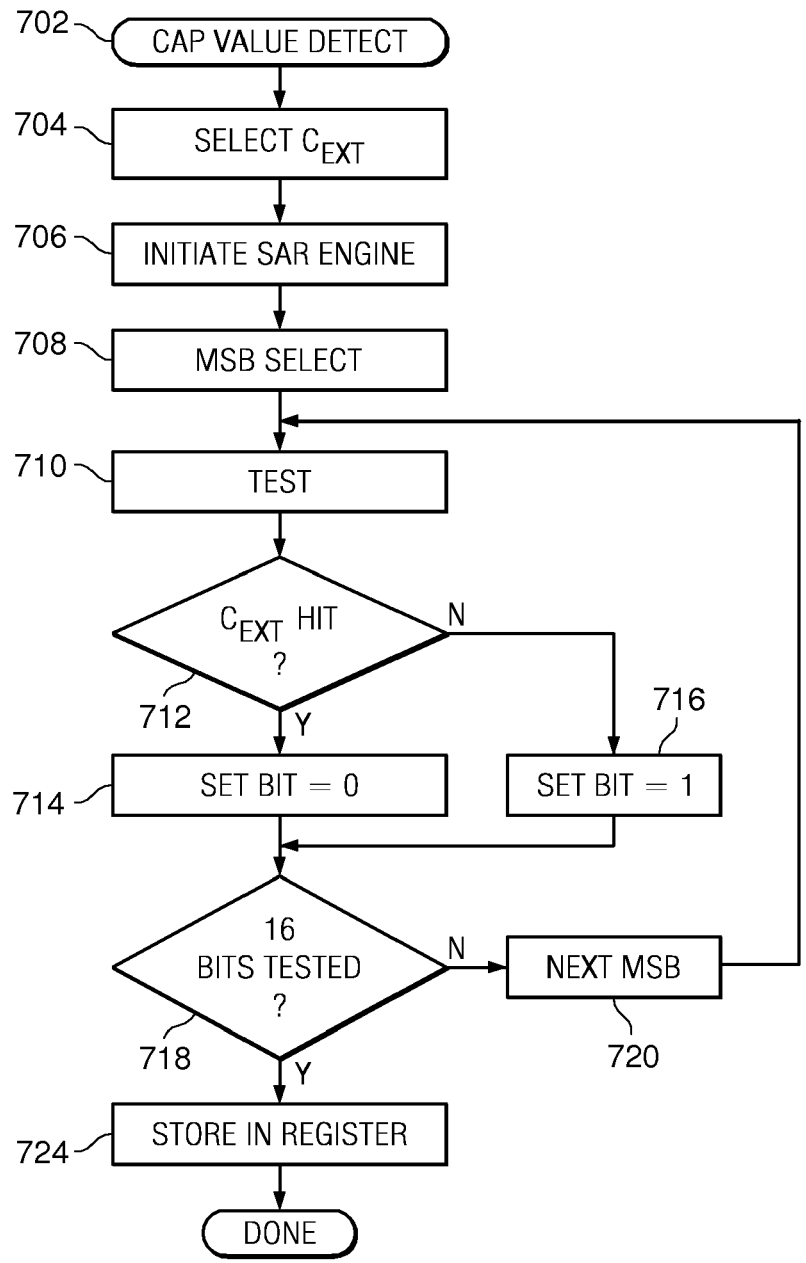
FIG. 7 illustrates a flow chart for the SAR algorithm for detecting the value of the capacitor on an external pin.

Referring now to FIG. 7, there is illustrated a flow chart depicting the operation of the SAR engine 510 which will be described in conjunction with the operation of the timing diagram of FIG. 6. The program is initiated at a block 702 and then proceeds to a function block 704. At function block 704, the multiplexer 544 is operable to select one of the pins. Note that with respect to FIG. 5a, the array is very simple and that each capacitor is connected to a separate pin on the output of the multiplexer, but it should be understood that the multiplexer could accommodate an array. It is only important that a single capacitor is selected for a given test. It is also noted that each capacitor has associated therewith a 16-bit register for storing the value of that capacitor after determination thereof.

Once selected, the program flows to a block 706 to initiate the SAR engine. The first step is to select the MSB, as indicated by a block 708. This essentially positions the capacitor at ½ value for the test. With reference to the timing diagram, this occurs on the falling edge of signal CP2. At this point, the voltages on the capacitors $C_{EXT}$ and $C_{REF}$ have been discharged to ground and will ramp-up to a voltage depending on the current provided thereto from the respective current sources 546 and 548. As noted herein above, the current source 546 is provided with a current DAC such that the value thereof is a function of the 16-bit value which, for the MSB is "1000000000000000." The program then flows to a function block 710 which is a test of the particular bit. This test is the ramp-up of the two voltages to determine which arrives at the reference voltage first. In essence, this is a race for both of these voltages to reach the reference voltage. The first one that reaches it will trigger its respective flip-flop 622 or 624. If the voltage on node 542 associated with $C_{REF}$ reaches $V_{REF}$ first, this will cause a reset to occur by causing the OR gate 628 of FIG. 6a to drive transistors 536 and 538 low. The purpose for this is to determine whether the $C_{EXT}$ signal reached $V_{REF}$ first. If the signal $C_{EXT}$ hits $V_{REF}$ first, this indicates that the value was not equal to the MSB, i.e., the capacitor is smaller than tested for. Thus, the next operation would be to decrease the current, i.e., set the MSB to "0" and set the next MSB to "1." Thus, the output of the flip-flop 622 indicates to the SAR engine 510 that the bit should be set to "0" by testing the "Q" output thereof. However, both outputs could be tested and more complex logic circuitry utilized to make this determination.

In any event, if $C_{EXT}$ rises too fast relative to $C_{REF}$, this indicates that the current needs to be lowered. Thus, when a $C_{EXT}$ hit is determined, the program flows along the "Y" path to a function block 714 from a decision block 712 to set the tested bit to "0." If it is determined that the $C_{EXT}$ ramp-up operation did not win the "race," then the program will flow along the "N" path from decision block 712 to a block 716 to set the current bit to "1" indicating that more current is needed. After the particular bit has been tested, the program flows to a decision block 718 to determine if all 16 bits have been tested and, if not, the program flows along a "N" path therefrom to a function block 720 to select the next MSB and then proceed back to the input of block 710 to again test this bit. This will proceed until all 16 bits are tested, at which time the program will flow from the decision block 718 along the "Y" path to a function block 724 to store this value in the register. As indicated above, this particular value represents the normalized value of the capacitor.

Knowing the absolute value of both currents in current sources 546 and 548 and the absolute value of the capacitor $C_{REF}$, it is possible to actually calculate the value of the capacitance. However, it is not important to calculate this value but, more importantly, to just have a 16-bit value for later determination as to if the value of that capacitor has altered. If the value has altered, a comparison will be made with the register to determine if the contents need to be changed and such will happen upon an alteration. This alteration will be noted to a program which will run an algorithm to determine if a "touch" is declared. Any type of algorithm could be utilized for this purpose. However, these algorithms can take many forms. They typically will utilize a number of accumulated changes in one direction or the other, and the frequency of these changes possibly, to make this determination. However, the primary purpose of the SAR engine is to determine a 16-bit value for that capacitor for use by the algorithm. This value then can be utilized for comparison with a previously stored value, etc., for determining if the change in capacitance value is of such a nature to declare that a touch has occurred.

Figure 8:
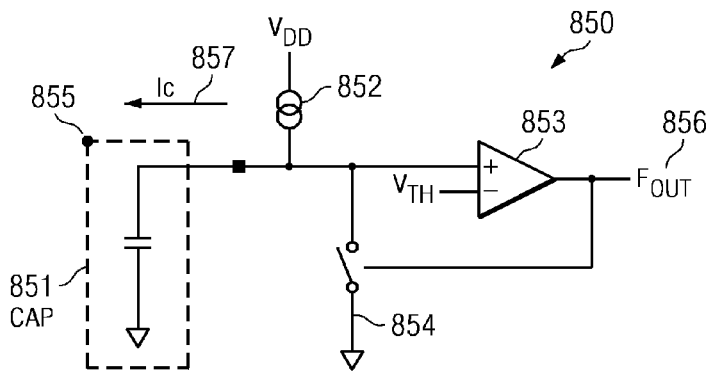
FIG. 8 illustrates another embodiment of the capacitive touch sense circuitry including a relaxation oscillator.

Referring now to FIG. 8, there is illustrated an alternative embodiment of the capacitive touch sense circuitry 252 for detecting a touch upon a capacitive sensor using a relaxation oscillator circuit rather than the circuitry described with respect to FIGS. 5-7. FIG. 8 illustrates one embodiment of a relaxation oscillator. The relaxation oscillator 850 is formed by the capacitance to be measured on capacitor 851, a charging current source 852, a comparator 853, and a reset switch 854. It should be noted that capacitor 851 is representative of the capacitance measured on a sensor element of a sensor array. The relaxation oscillator is coupled to drive a charging current (Ic) 857 in a single direction onto a device under test ("DUT") capacitor, capacitor 851. As the charging current piles charge onto the capacitor 851, the voltage across the capacitor increases with time as a function of Ic 857 and its capacitance C. The following equation describes the relation between current, capacitance, voltage and time for a charging capacitor.

$$CdV = I_c dt \quad (1)$$

The relaxation oscillator begins by charging the capacitor 851 from a ground potential or zero voltage and continues to pile charge on the capacitor 851 at a fixed charging current Ic 857 until the voltage across the capacitor 851 at node 855 reaches a reference voltage or threshold voltage, $V_{TH}$ 855. At $V_{TH}$ 855, the relaxation oscillator allows the accumulated charge at node 855 to discharge (e.g., the capacitor 851 to "relax" back to the ground potential) and then the process repeats itself. In particular, the output of comparator 853 asserts a clock signal $F_{OUT}$ 856 (e.g., $F_{OUT}$ 856 goes high), which enables the reset switch 854. This resets the voltage on the capacitor at node 855 to ground and the charge cycle starts again. The relaxation oscillator outputs a relaxation oscillator clock signal ($F_{OUT}$ 856) having a frequency ($f_{RO}$) dependent upon capacitance C of the capacitor 851 and charging current Ic 857.

The comparator trip time of the comparator 853 and reset switch 854 add a fixed delay. The output of the comparator 853 is synchronized with a reference system clock to guarantee that the comparator reset time is long enough to completely reset the charging voltage on capacitor 855. This sets a practical upper limit to the operating frequency. For example, if capacitance C of the capacitor 851 changes, then $f_{RO}$ will change proportionally according to Equation (1). By comparing $f_{RO}$ of $F_{OUT}$ 856 against the frequency ($F_{REF}$) of a known reference system clock signal (REF CLK), the change in capacitance $\Delta C$ can be measured. Accordingly, equations (2) and (3) below describe that a change in frequency between $F_{OUT}$ 856 and REF CLK is proportional to a change in capacitance of the capacitor 851.

$$\Delta C \alpha \, f, \text{ where} \quad (2)$$

$$\Delta f = f_{RO} - f_{REF} \quad (3)$$

In one embodiment, a frequency comparator may be coupled to receive relaxation oscillator clock signal ($F_{OUT}$ 856) and REF CLK, compare their frequencies $f_{RO}$ and $f_{REF}$, respectively, and output a signal indicative of the difference $\Delta f$ between these frequencies. By monitoring $\Delta f$ one can determine whether the capacitance of the capacitor 851 has changed.

In one exemplary embodiment, the relaxation oscillator 850 may be built using a 555 timer to implement the comparator 853 and reset switch 854. Alternatively, the relaxation oscillator 850 may be built using other circuitiry. Relaxation oscillators are known by those of ordinary skill in the art, and accordingly, additional details regarding their operation have not been included so as to not obscure the present embodiments.

Figure 9:
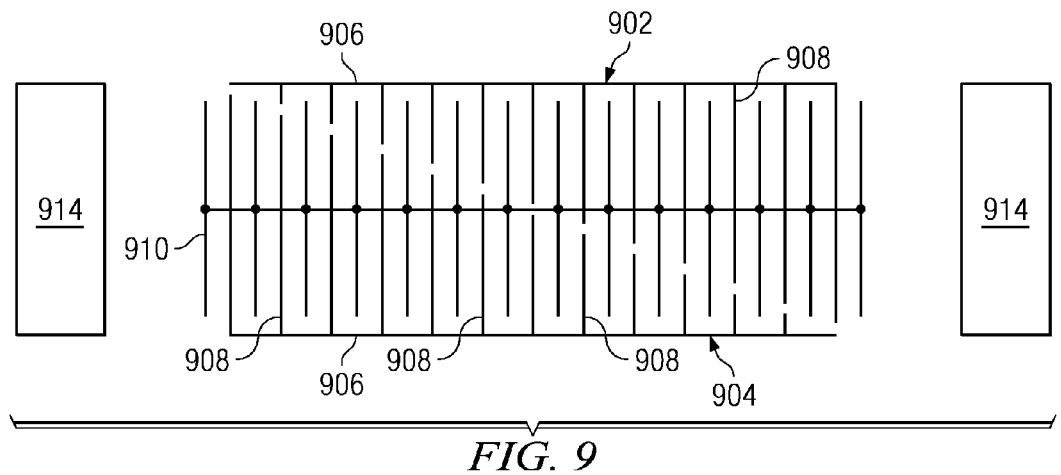
FIG. 9, 9A, and 9B are top views illustrating examples of a capacitive touch slider.

Referring now to FIG. 9, there is illustrated a capacitive touch slider 900 consisting of a first node 902 and a second node 904. This capacitive touch slider array 900 would be used with respect to the sensor circuitry described in FIG. 8. Each of the nodes 902 and 904 include a plate or trace 906 including a plurality of fingers 908 extending perpendicular therefrom. The fingers 908 of each node 902 and 904 are of increasing length or decreasing length from one end of the capacitive touch slider array 900 to the other. Thus, as can be seen in FIG. 9, the length of the fingers 908 connected to node 902 increase in length from the right side of the capacitive slider array 900 to the left side of the capacitive slider array 900. Similarly, the lengths of the fingers 908 connected to node 904 decrease in length from the right side of the capacitive slider array 900 to the left side of the capacitive slider array 900.

In the embodiment of FIG. 9, a ground node 910 has associated fingers 912 interleaved between the fingers 908 associated with nodes 902 and 904. When the ground node 910 and the fingers associated with the ground node are interleaved between the fingers 908, the capacitances described previously with respect to FIG. 4 are created when a conductive object comes in contact with the capacitive touch slider array 900. The fingers comprise conductive traces or plates of some type within the capacitive touch slider array 900.

The conductive traces 906 and associated conductive fingers 908 associated with each of nodes 902 and 904 enable determinations of a position of a conductive element (i.e., a finger) that is contacting the capacitive touch slider array 900 responsive to capacitance measurements made with respect to nodes 902 and 904. Due to the varying lengths of the conductive fingers 908 associated with each of nodes 902 and 904, by determining the ratio of capacitances between nodes 902 and 904 a determination of the position of a conductive element upon the array 900 may be made. For example, if the ratio of capacitances detected between nodes 902 and 904 is one (i.e., substantially equal), a determination may be made that the conductive element lies substantially within the center of the capacitive touch slider array 900. The equal capacitances are provided due to the fact that the conductive fingers 908 associated with nodes 902 and 904 within the center of the capacitive touch slider array 900 are substantially equal in length at the center location. If the ratio of the capacitances between nodes 902 and 904 are substantially weighted towards the capacitance associated with node 902 a determination may be made that the conductive element is contacting the array 900 at a location toward the right side of the capacitive touch slider array 900. The particular location may be determined based upon the exact ratio. A determination may be made of the position based upon the length of the fingers associated with respect to node 902 with respect to the length of the fingers 908 associated with node 904 wherein the ratio of the capacitance corresponds to the ratio of the lengths of the fingers.

Similarly, if the ratio of the capacitances measured at nodes 902 and 904 are more heavily weighted toward node 904, a determination may be made that the conductive element is contacting the capacitive touch slider array 900 on the left side of the array. The particular location may again be determined based upon the exact ratio as each of the associated pairs of fingers 908 of node 902 with respect to node 904 have varying ratios depending upon the location within the array as the size of one set of fingers (node 904) is increasing toward the left end of the array and the length of the fingers 908 associated with node 902 are decreasing toward the left end of the array.

The capacitive slider array 900 additionally includes a pair of capacitive touch switch end caps 914, one at each end of the capacitive touch slider array. The capacitive touch switch end caps 914 improve the performance of the array at each of the extreme ends of the slider array 900 when it is not possible to physically limit the placement of the finger to an area over the sensing nodes 902 and 904. Movement of a user's finger off the extreme ends of the capacitive slider array 900 can provide incorrect indications of placement of a user's finger at a position on the array from measurements made solely at nodes 902 and 904. When one of the end caps 914 is actuated this provides an indication that the switch is located at the end of the array 900 associated with the end cap 914. The use of the capacitive end caps 914 enables a switch at each extreme end of the slider array 900 to provide an indication of when a user's finger has reached an end of the array and inaccurate readings from the slider array indicating location of the finger in a differing position on the slider array may be ignored.

The overall shape of the slider array 900 can be modified to form a variety of geometries such as a square, rectangle, or may even be wrapped into an arc or circle, as FIGS. 9A-9B and 10A-10B illustate. The complete geometry can also be stepped to provide a two-dimensional position detection capability.

Figure 10:
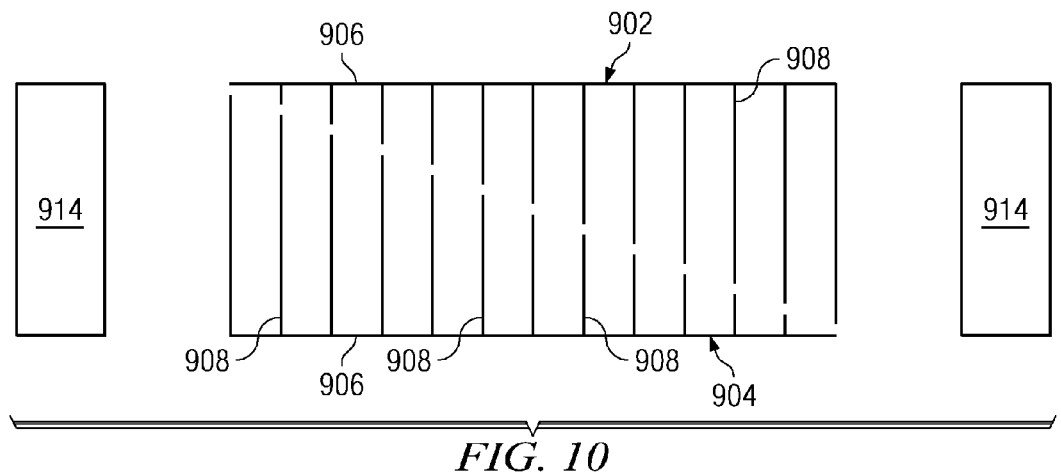
FIG. 10, 10A, and 10B are top views of alternative embodiments of a capacitive touch slider.
Figure 9A:
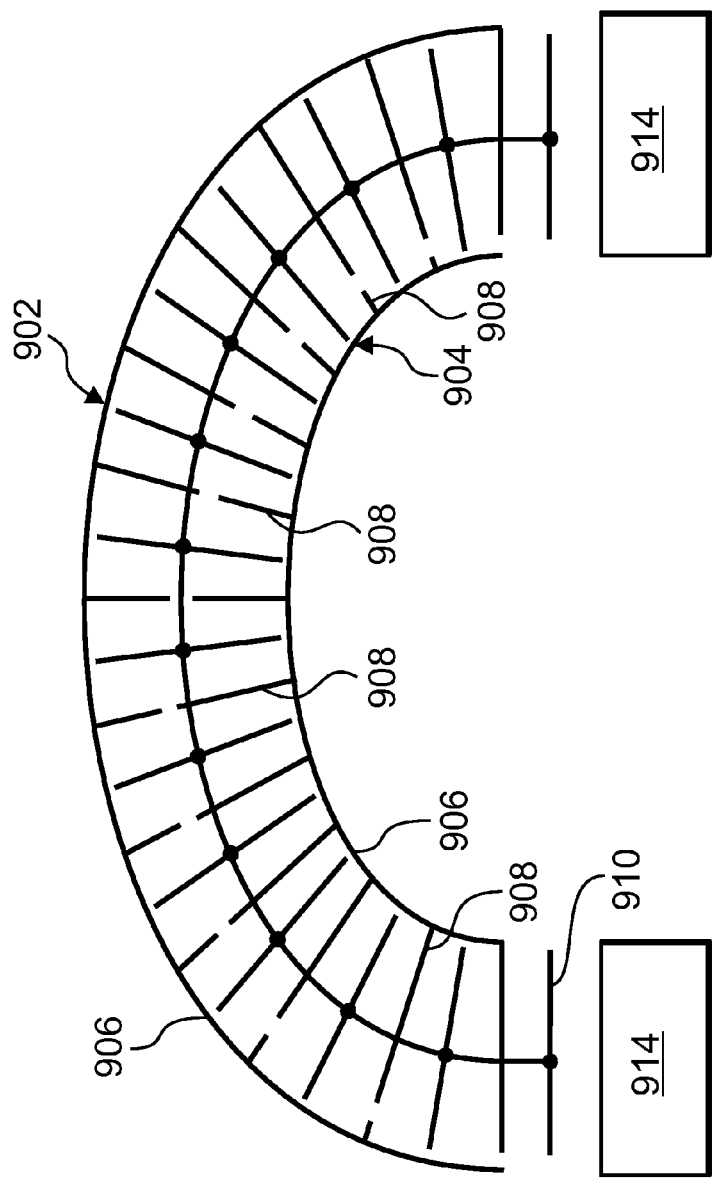
Figure 9B:
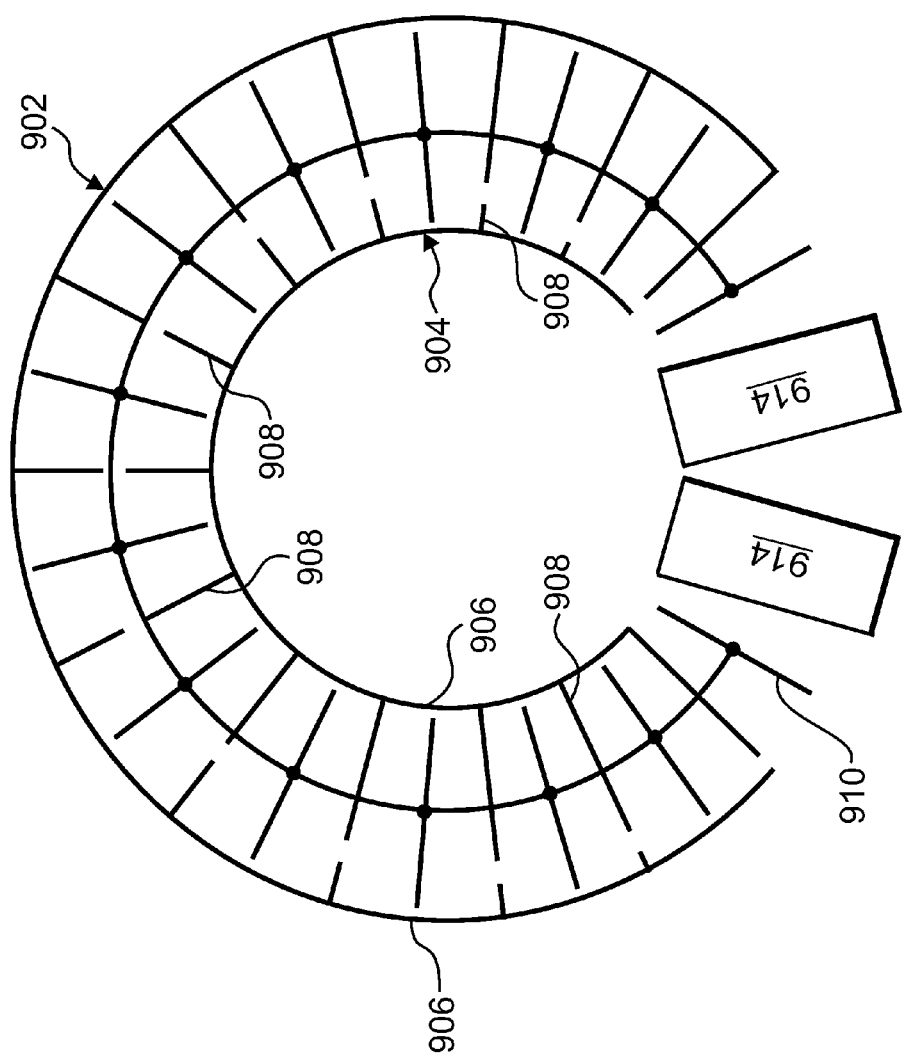
Figure 10A:
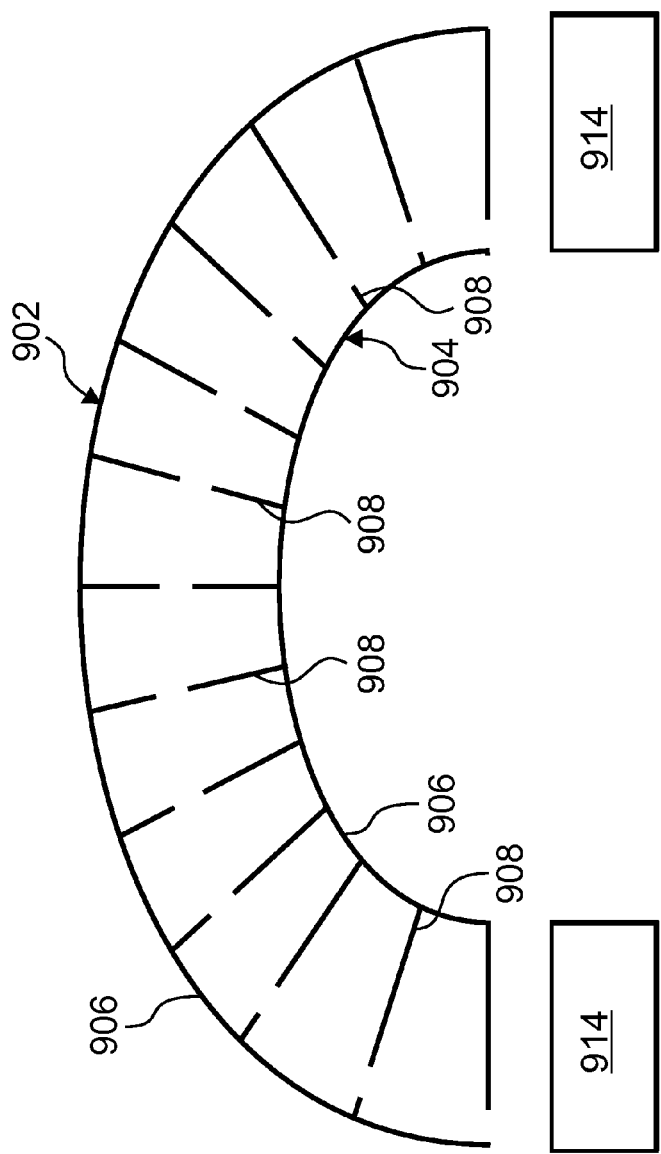
Figure 10B:
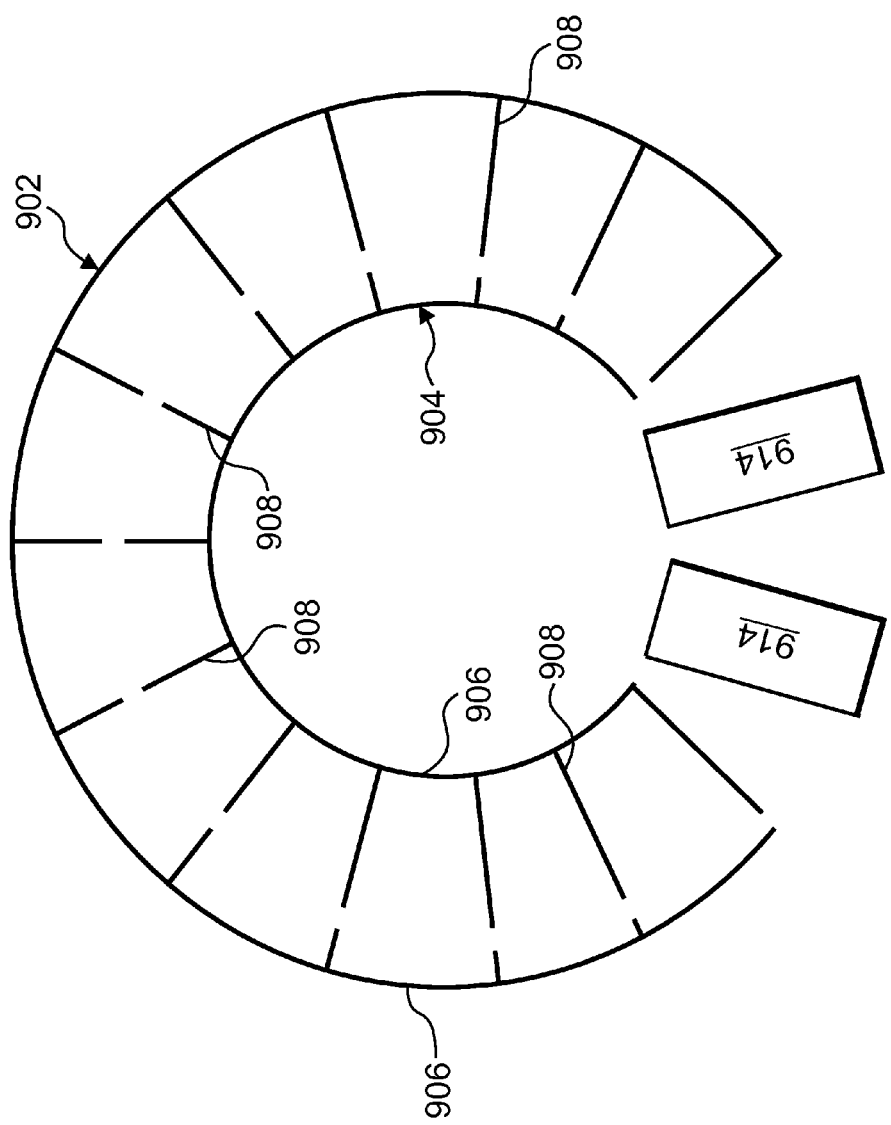

Referring now also to FIG. 10, there is illustrated an alternative embodiment of the capacitive touch slider array 900 wherein the ground node 910 is not included. This configuration could be used with the capacitive sense circuitry discussed with respect to FIGS. 5-7. In this case, the structure associated with each of the sensing nodes 902 and 904 is the same as that described previously with respect to FIG. 9. Plates 906 are associated with each of nodes 902 and 904 and a series of progressively increasing or decreasing length fingers 908 extend outwards toward each other from each of the nodes 902 and 904. When measuring capacitances associated with each of nodes 902 and 904, the opposite plate or trace is temporarily connected to ground during the measurement. Thus, when capacitance measurements were being made with respect to node 902, node 904 would be connected to ground and similarly when capacitance measurements were being made on node 904, node 902 would be connected to ground. Capacitive touch switch end caps 914 are included at the extreme ends of the slider array 900. The ratio of capacitance between the nodes and the associated finger lengths are used to determine exact points of contact of a conductive element with the slider array as described above.

Figure 11:
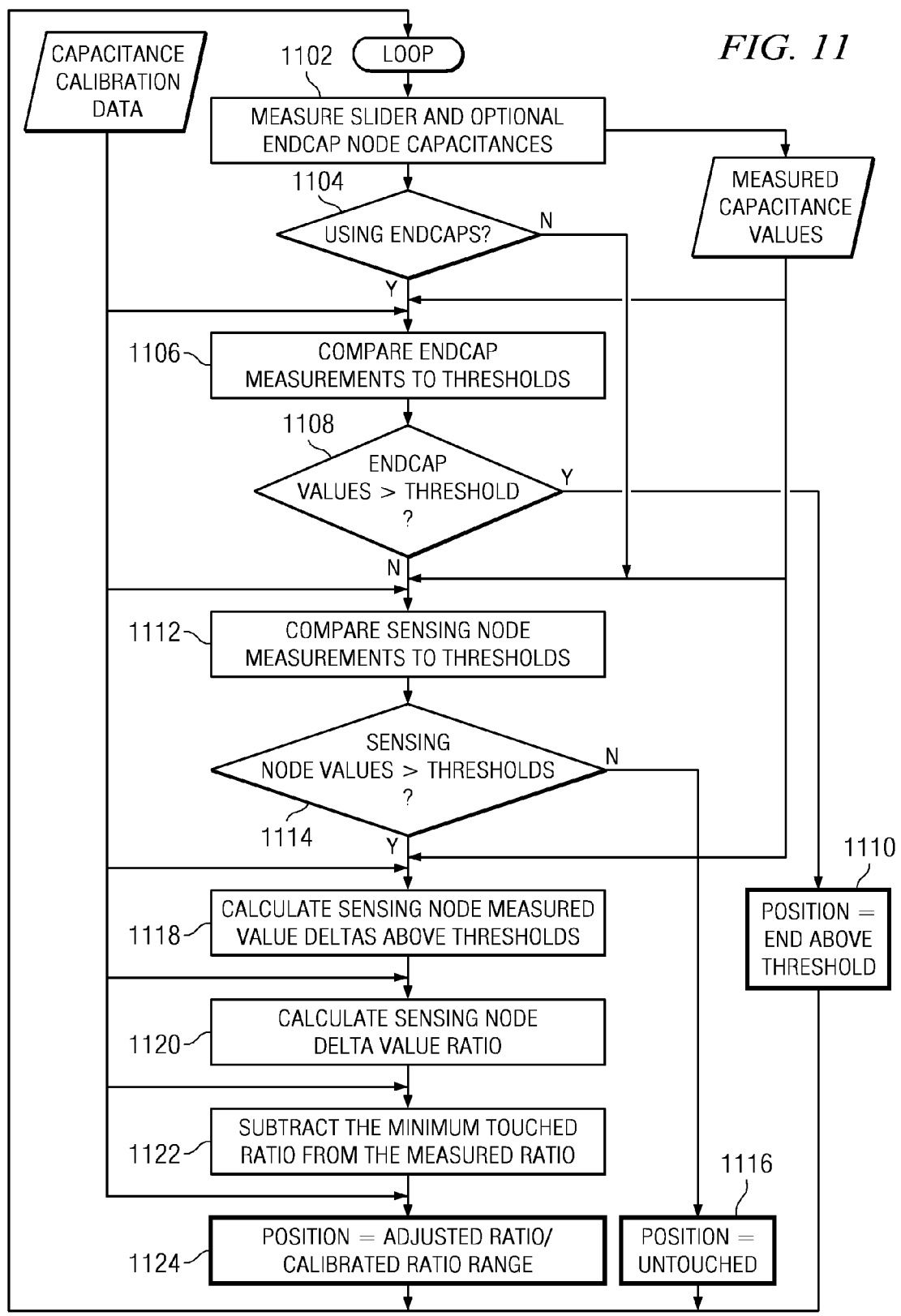
FIG. 11 illustrates a flow diagram describing the manner for determining a position of a finger actuation along the capacitive touch slider.

Referring now to FIG. 11, there is illustrated a flow diagram describing the manner in which the position of a conducting element upon the slider array 900 can be determined by making capacitive measurements on nodes 802 and 804 and determining a ratio between the measured capacitances. The ratio varies based upon the placement of a conducting element (i.e., the finger) upon the capacitive touch slider array 900. The measurement of the capacitance values may be made in any known manner including those described previously herein with respect to FIGS. 5-8. Thus, the capacitive measurements can be made by any variety of techniques, and the capacitive data can be analyzed in accordance with the below described algorithm to determine the position of the conducting element along the slider 900. Appendix A includes the code for implementing one version of the process of FIG. 11. However, it will be recognized that other implementations are possible.

Initially, at step 1102 measurements are made of the capacitances associated with each sensing node of the capacitive touch slider array 900 and for the end cap nodes. At inquiry step 1104, a determination is made if the sliding capacitor array is using the end caps with the array. If so, control passes to step 1106 and a comparison is made of the measured capacitances of the end caps to established thresholds associated with the end caps. The thresholds associated with the end caps indicate a capacitive level indicating an actuation of one of the end cap sensors. Inquiry step 1108 determines whether the measured capacitance values of the end caps exceed the predetermined threshold values. If the measured end cap capacitance values exceed the threshold, this provides an indication that the finger or conductive element is in a position associated with the capacitive end caps and this is indicated at step 1110. Control passes back to step 1102 to again monitor for conductive element positioning upon the capacitive touch slider array.

If inquiry step 1108 determines that the measured end cap capacitance values do not exceed the threshold values, or if inquiry step 1104 indicates that end caps are not being used with the slider array, control passes to step 1112 where a comparison is made between the capacitance values measured at the sensing nodes and the threshold values associated with the sensing nodes. Inquiry step 1114 determines if the measured node capacitance values exceed the established thresholds. If not, control passes to step 1116 to provide an indication that there is no finger or conductive element and control passes back to step 1102.

If inquiry step 1114 determines that the sensed node capacitance values exceed the threshold values (a finger is present), the sensing node measured value deltas above the established thresholds is calculated at step 1118. The sensing node delta value ratio is calculated at step 1120. Calculation of the sensing node measured delta value ratio involves determining a capacitive ratio of one node with respect to the other. The measured ratio has the minimum touched ratio subtracted therefrom at step 1122. This enables a determination of the position of the conducting element or finger at step 1124 upon the capacitive slider array wherein the adjusted ratio/calibrated ratio range comprises the position of the finger on the slider array. Control passes back to step 1124. The steps of comparing measured capacitance values to threshold values at step 1006 and 1012 and the steps of calculating ratios associated with the measured values require the use of capacitance calibration data.

It will be appreciated by those skilled in the art having the benefit of this disclosure that this method and apparatus for implementing a capacitive touch slider array having a plurality of variable length conductive fingers. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A capacitive touch slider array, comprising:
a first conductive trace associated with a first sensing node, the first conductive trace including a first conductive line and a plurality of first conductive fingers extending from the first conductive line, the plurality of first conductive fingers having lengths that increase from a first end of the capacitive touch slider array to a second end of the capacitive touch slider array;
a second conductive trace associated with a second sensing node, the second conductive trace including a second conductive line and a plurality of second conductive fingers extending from the second conductive line, the plurality of second conductive fingers having lengths that increase from the second end of the capacitive touch slider array to the first end of the capacitive touch slider array; and
a third conductive trace associated with a ground node, the third conductive trace interleaved between the first plurality of conductive fingers and the second plurality of conductive fingers.

2. The capacitive touch slider array of claim 1, wherein each of the first plurality of conductive fingers are in a same axis as a particular one of the second plurality of conductive fingers.

3. The capacitive touch slider array of claim 1, further including:
a first capacitive sensor located at the first end of the capacitive touch slider array; and
a second capacitive sensor located at the second end of the capacitive touch slider array.

4. The capacitive touch slider array of claim 1, wherein each position between the first end and the second end of the capacitive touch slider array has a unique ratio of capacitance of the first sensing node to the second sensing node responsive to a conductive element contacting a position on the capacitive slider array.

5. The capacitive touch slider array of claim 1, wherein a geometry of the first and second conductive traces is shaped to provide a two-dimensional position detection capability.

6. The capacitive touch slider array of claim 1, wherein a geometry of the first and second conductive traces is shaped into at least one of an arc or circle.

7. A capacitive touch slider array, comprising:
a first conductive trace associated with a first sensing node, the first conductive trace including a first conductive line and a plurality of first conductive fingers extending from the first conductive line, the plurality of first conductive fingers having lengths that increase from a first end of the capacitive touch slider array to a second end of the capacitive touch slider array;
a second conductive trace associated with a second sensing node, the second conductive trace including a second conductive line and a plurality of second conductive fingers extending from the second conductive line, the plurality of second conductive fingers having lengths that increase from the second end of the capacitive touch slider array to the first end of the capacitive touch slider array;
a third conductive trace associated with a ground node, the third conductive trace interleaved between the first plurality of conductive fingers and the second plurality of conductive fingers;
a first capacitive sensor located at the first end of the capacitive touch slider array; and
a second capacitive sensor located at the second end of the capacitive touch slider array.

8. The capacitive touch slider array of claim 7, wherein each of the first plurality of conductive fingers are in a same axis as a particular one of the second plurality of conductive fingers.

9. The capacitive touch slider array of claim 7, wherein each position between the first end and the second end of the capacitive touch slider array has a unique ratio of capacitance of the first sensing node to the second sensing node responsive to a conductive element contacting a position on the capacitive slider array.

10. The capacitive touch slider array of claim 7, wherein a geometry of the first and second conductive traces is shaped to provide a two-dimensional position detection capability.

11. The capacitive touch slider array of claim 7, wherein a geometry of the first and second conductive traces is shaped into at least one of an arc or circle.

12. A method for determining a position of a conducting element on a capacitive touch slider array, comprising the steps of:
sensing a capacitance at a first node and a second node associated with the capacitive touch slider array, the first node associated with a first conductive trace having a first plurality of conductive fingers, the second node associated with a second conductive trace having a second plurality of conductive fingers, and a third conductive trace associated with a ground node, the third conductive trace interleaved between the first plurality of conductive fingers and the second plurality of conductive fingers;
calculating a ratio using capacitances associated with the first node and the second node; and
determining the position of the conductive element on the capacitive touch slider array responsive to the calculated ratio.

13. The method of claim 12, further including the step of determining if a capacitive sensor associated with an end of the capacitive touch slider array has been actuated.

14. The method of claim 12, wherein the step of determining the position further comprises the step of determining the position of the conductive element on the capacitive touch slider array responsive to the calculated ratio and an indication that the capacitive sensor associated with an end of the capacitive touch slider array has been actuated.

15. The method of claim 13, wherein the step of determining if the capacitive sensor has been actuated further comprises the steps of:
comparing the sensed capacitance at the capacitive sensor with a predetermined threshold value;
determining if the sensed capacitance at the capacitive sensor is greater than the predetermined threshold value; and
determining that the capacitive sensor is actuated if the sensed capacitance is greater than the predetermined threshold value.

16. The method of claim 12, wherein the step of calculating further includes the steps of:
comparing the sensed capacitance at the first node and the second node with predetermined threshold values;
determining if the sensed capacitance at the first node and the second node are greater than the predetermined threshold values; and
calculating the ratio using the capacitances associated with the first node and the second node if the sensed capacitances at the first node and the second node are greater than the predetermined threshold values.

17. The method of claim 16, further including the step of subtracting a minimum touched ratio from the calculated ratio.

* * * * *